(12) United States Patent
De Cecco et al.

(10) Patent No.: US 6,370,035 B1
(45) Date of Patent: Apr. 9, 2002

(54) ELECTRONIC CIRCUIT PACK AND SHELF AND ELECTRONIC CIRCUIT PACK COMBINATIONS

(75) Inventors: Stefano De Cecco; David Kiesekamp, both of Ottawa; Bevin Schmidt, Dunrobin; Simon Davis, Metcalfe, all of (CA)

(73) Assignee: Alcatel Canada Inc., Kanata (CA)

( * ) Notice: Subject to any disclaimer, the term of this patent is extended or adjusted under 35 U.S.C. 154(b) by 0 days.

(21) Appl. No.: 09/472,909

(22) Filed: Dec. 27, 1999

(51) Int. Cl.[7] .............................. H05K 7/14; H05K 9/00
(52) U.S. Cl. ...................... 361/796; 361/759; 361/797; 361/799; 361/801; 361/818
(58) Field of Search .................. 174/250, 254, 174/255; 361/799, 800, 802, 801, 816, 818, 747, 741, 740, 756, 759, 684, 686, 752, 753, 796, 797, 807, 809; 211/41.17

(56) References Cited

U.S. PATENT DOCUMENTS 5,999,411 A * 12/1999 Patel ........................... 361/759
6,266,248 B1 * 7/2001 Hanas et al. ................. 361/752
6,282,101 B1 * 8/2001 Hanas et al. ................. 361/818

* cited by examiner

Primary Examiner—Jayprakash N. Gandhi
Assistant Examiner—John B. Vigushin (57) ABSTRACT

An electronic circuit pack having a printed circuit board with a faceplate at a front of the board. The faceplate has two end regions carrying latches for holding the board into a shelf. A front wall of the faceplate has an intermediate part between the end regions, the intermediate part extending forwardly of the end regions and lying at least between the latches. Preferably, the intermediate part of the front wall extends as far as a frontal vertical plane of the shelf which is the foremost position allowable for a shelf and a circuit board combination. The intermediate part of the front wall lying in this forward position provides additional space behind it for extending the electronic circuitry of the circuit pack for a unitary shelf size. This additional space is occupied by the printed circuit board with conductors and electronic components and/or connectors for test purposes and memory cards.

28 Claims, 6 Drawing Sheets

ELECTRONIC CIRCUIT PACK AND SHELF AND ELECTRONIC CIRCUIT PACK COMBINATIONS

FIELD OF THE INVENTION

This invention relates to electronic circuit packs and shelf and electronic circuit pack combinations.

BACKGROUND

In the electronics industry, electrical equipment includes shelves which receive circuit packs into shelf receiving stations in which the circuit packs are in electronically operational positions. Conventionally, means are included in each pack to secure the pack in its operational position and which also allows for pack removal from its receiving station. In each pack, this securing means is normally in the form of two latches which are pivoted at opposite end parts of a face plate at the front end region of the pack. The latches operate against abutment surfaces of the shelf with a levering motion to move into latching positions while urging the circuit pack along a small and final stage of movement into its operational position. In this position, electronic circuitry of the pack is electrically connected into a back or mid plane at the rear of the shelf. Each latch has an operating lever to enable latch movement into and out of its latching position. The operating lever needs to be accessible from the front of the shelf for manual operation.

For safety reasons and to prevent equipment damage, it is an industry requirement that each shelf shall have a frontal plane, as specified in Bellcore GR-63-CORE and ETSI 300-119-2, beyond which a circuit pack must not project when in its operational position. This requirement hence places a restriction on the size of each circuit pack which may be received in a receiving station, thereby restricting the space available for the electronic circuitry of the pack. Thus, the surface area of a substrate, e.g. a printed circuit board, is limited with attendant restrictions upon the placement and availability of location spaces for conductor lines and electrical components of the electronic circuitry carried upon the substrate. In order to maximize the potential surface area available for electronic circuitry of a circuit pack to be disposed within a shelf, the latches are suitably designed so that, in their latching positions, their operating levers tend to lie towards vertical positions when the circuit pack is in its operational position within the shelf. In this position, the operating levers lie at, or behind but close to, the frontal plane of the shelf. To enable the levers to be manually accessible for pivoting the levers out of their latching positions, the faceplate and the electronic circuitry are placed rearwardly of the vertical locations of the operating levers.

SUMMARY OF THE INVENTION

The present invention seeks to provide an electronic circuit pack and a shelf and electronic circuit pack combination which is constructionally different while enabling greater scope for circuitry design.

Accordingly, the present invention provides an electronic circuit pack comprising a substrate carrying electronic circuitry and a faceplate mounted to a front region of the substrate, and the faceplate having a front wall extending along and forwardly of the front region of the substrate and the front wall having; i) two end parts provided at end regions of the faceplate, each end region carrying means for securing the circuit pack into a shelf; and ii) an intermediate part extending between the two end parts and disposed forwardly of the two end parts; a portion of the electronic circuitry directly behind the intermediate part of the front wall projecting forwardly of the two end parts of the front wall towards the intermediate part.

With the above circuit pack according to the invention, as with conventional packs, the position of the securing means and end regions of the faceplate are controlled by shelf size and geometry. The invention is, however, based upon the novel concept that the whole of the front wall of the faceplate need not necessarily be designed to be positioned at the same distance from the frontal plane of the shelf. Hence, in a practical structure, the securing means comprises latches at the end regions of the faceplate, the latches being pivotal to move into and out of latching positions for holding the circuit pack in a shelf, and the intermediate front wall part of the faceplate extends forwardly between the latches. The intermediate front wall part is disposed preferably in at least the forward position of the operating levers when the latches are in their locking positions. The electronic circuitry then occupies space defined behind the intermediate front wall part of the faceplate, but forwards of the end parts of the front wall.

It follows that for any particular requirement of shelf geometry and size, a circuit pack has an additional space available for its electronic circuitry behind the faceplate. This additional space may be used for increase in substrate size together with attendant space available for conductor lines and/or location of electronic components upon the substrate. Alternatively, the electronic components may extend into this additional space from the substrate without the substrate itself extending into the space. In a case where electronic components are disposed within the additional space, these components may include interface test components such as PCMCIA cards or may be memory cards which are accessible for connection to mating connectors through apertures in the faceplate.

The invention also includes a shelf and electronic circuit pack combination having a circuit pack according to the above invention fitted into a receiving station of the shelf.

BRIEF DESCRIPTION OF THE DRAWINGS

Embodiments of the invention will now be described, by way of example, with reference to the accompanying drawings, in which.

DESCRIPTION OF PREFERRED EMBODIMENTS

Figure 1:
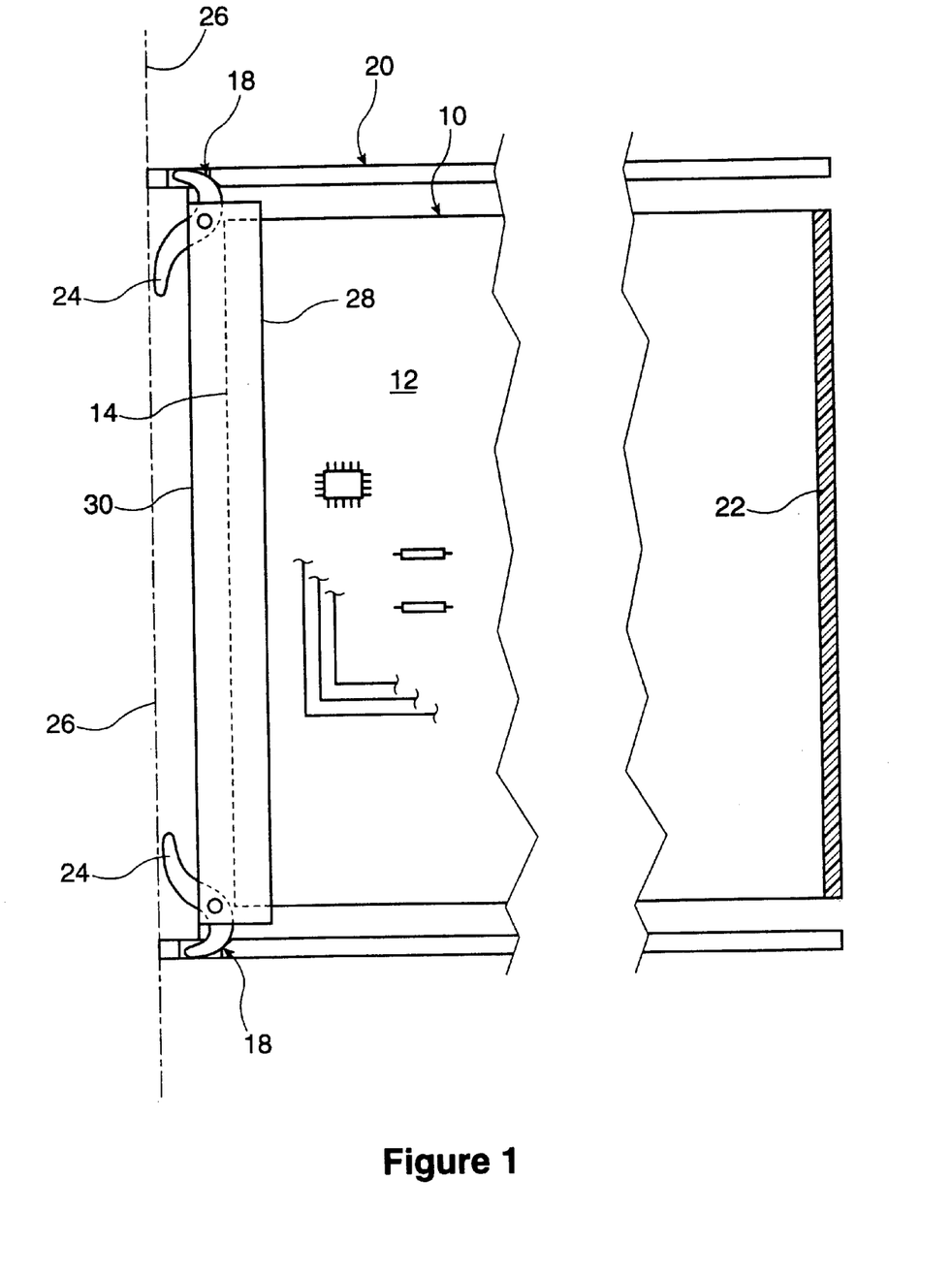
FIG. 1 is a side elevational view, partly diagrammatic, of a conventional circuit pack fitted into a shelf.

In a conventional circuit pack construction for fitting into a shelf of electronic equipment, as shown in FIG. 1, a circuit pack 10 comprises a substrate in the form of a printed circuit board 12 having a front edge 14. A faceplate 28 is mounted upon and forwardly of the printed circuit board 12 with a front wall 30 of the faceplate positioned slightly forwards of the front edge 14 of the printed circuit board. Two end regions of the faceplate carry latches 18. These latches, as is well known, are moveable into and out of locking positions to hold the circuit pack 10 in a receiving station in the shelf 20. In this position, shown by FIG. 1, the circuit pack 10 is in its operational position in which it is electrically connected into a back or mid plane 22 of the equipment.

Each of the latches 18 has an operating lever 24 which, with the latch in its locking position, extends towards a vertical position when the circuit pack is mounted in the shelf. The latches are basically of conventional construction. The operating parts which hold the latches in their locking positions against the faceplate are not described in this specification, both for this prior construction of FIG. 1, and for the embodiment and modification to be described. For purposes of clarity, these operating parts are omitted from all of the drawings.

The front of the shelf 20 is dictated by a frontal vertical plane, shown in chain dotted by reference 26. As required by the electronics industry, the whole of the circuit pack including the latches, should lie no further forward than this frontal vertical plane. In order to maximize the printed circuit board area for electronic usage, the operating levers 24, in the latch locking positions, lie close to or up to the frontal vertical plane 26.

Hence it follows that the forwardmost portions of the circuit pack are actually the operating levers 24 of the latches. The front wall 30 of the faceplate and the front edge 14 of the printed circuit board 12 lie in vertical planes behind the operating levers thus providing access to the levers for manual operation to move the latches into and out of their locking positions. As may be seen, therefore, the electronic circuitry provided by the printed circuit board 12 and the electronic components which it supports, is necessarily spaced a predetermined distance behind the frontal vertical plane 26 of the shelf 20 in a typical conventional circuit pack construction.

Figure 2:
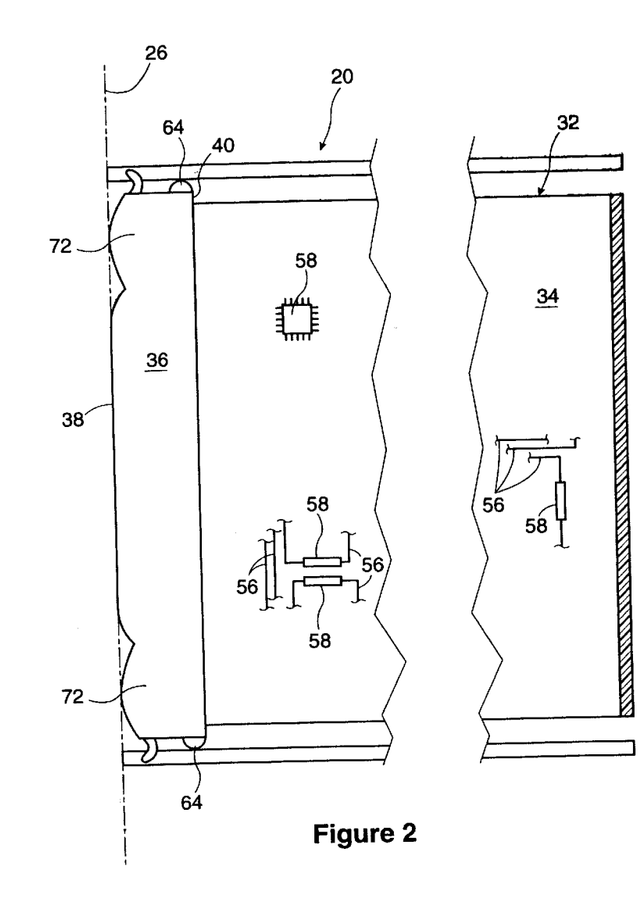
FIG. 2 is a partly diagrammatic side elevational view of a circuit pack according to a first embodiment, fitted into a shelf.
Figure 3:
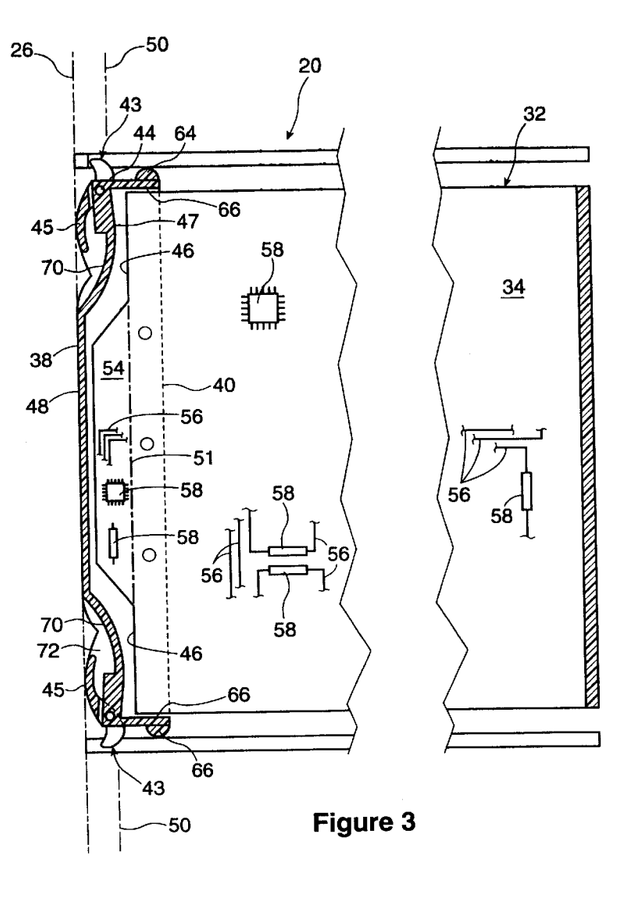
FIG. 3 is a vertical cross-sectional view in side elevation through a the circuit pack of the embodiment.

As illustrated diagrammatically in FIGS. 2 and 3, the present invention increases the area available behind a faceplate for the provision of electronic circuitry in a circuit pack in a unitary shelf construction.

As shown by FIG. 2, in which features similar to those in FIG. 1 bear the same reference numerals, in a first embodiment of the invention, a circuit pack 32 has a printed circuit board 34. At the front of the printed circuit board 34 is positioned a faceplate 36 which has a front wall 38. The faceplate 36 has two side flanges 40 which extend rearwardly of the front wall to attach the faceplate to the printed circuit board 34, as will be described.

As shown particularly by FIG. 3, two end regions 42 of the faceplate each carry means for securing the circuit pack into the shelf 20. This securing means comprises two latches 43 having operating levers 45. Each operating lever 45, as shown by FIGS. 2 and 3, lies substantially vertically with the latches in the locking positions with the levers slightly rearwardly of the frontal vertical plane 26. A pivotal pin 44 of each latch is positioned rearwardly of the frontal vertical plane 26 at a distance similar to those in the conventional construction described above. Hence, the end parts 47 of the faceplate front wall 38 cannot be closer to the frontal vertical plane 26 than the front wall 30 in the conventional construction. This places a similar restraint on the forward positioning of front edge end parts 46 of the printed circuit board 34 which lie directly behind the end parts 47 of the front wall 38, as shown by FIG. 3.

The first embodiment differs, according to the inventive concept, from the conventional construction however, basically in that an intermediate part 48 of the front wall extending between end parts 47 is disposed forwardly of the two end parts 47, as shown by FIGS. 2 and 3. The reason for this is to provide an additional space behind the intermediate part 48 of the front wall for the accommodation of the electronic circuitry of the circuit pack. With the end parts 47 lying substantially along a vertical plane 50 (FIG. 3), the intermediate front wall part 48 may extend to any desired position forwardly of the vertical plane 50, and up to the frontal plane 26, while providing this additional space. Ideally, as in the embodiment, the intermediate front wall part 48 extends to a position substantially coinciding with the frontal plane when the circuit pack is in its operational position in the shelf 20. This then provides the largest possible additional space for accommodation of the electronic circuitry above that found in conventional constructions.

The electronic circuitry of the circuit pack 32 extends into this additional space to terminate slightly behind the intermediate front wall part 48 of the front wall. In this embodiment, as shown in FIG. 3, the extension to the electronic circuitry is provided primarily by a forward extension 54 of the printed circuit board 34 from between the front end edge parts 46. The size of the extension 54 is shown diagrammatically by the area of the printed circuit board in front of the chaindotted line 51 which coincides with the front edge end parts 46 of the board. The forward extension 54 carries electrically conductive lines 56 and electronic components 58 similar to the remainder of the board, the conductor lines and components being only simply represented.

Hence, as shown by the embodiment, constructions according to the invention provide space available within a circuit pack for its electronic circuitry additional to that possible with prior constructions. It follows that there is more freedom for circuitry design leading to increased circuit capability within a unitary shelf space.

As indicated above, the faceplate 36 has two side flanges 40. As shown particularly by FIG. 6, these side flanges 40 are spaced apart by the width of the front wall 38 of the faceplate. The printed circuit board 34 extends between the side flanges and at least one of the side flanges is secured to the printed circuit board. The faceplate is molded from a suitable plastic and has its inner and outer surfaces coated with an electrically conductive metal which forms part of an electromagnetic shield to prevent electromagnetic radiation passing through the faceplate to or from the circuitry of the circuit pack. Unless proper steps are taken, this surface coating could present problems with electrostatic discharge which could deleteriously affect the electronic circuitry of the circuit pack. For this reason the electronic circuitry, which includes not only the printed circuit board 34 but also electronic components 58 mounted upon it, must be a required distance from the surface coating of the faceplate to ensure electrical isolation from it. Thus the minimum distance between the electronic circuitry and the faceplate is set at 0.25" according to conventional standards for faceplate isolation. Further, a securing means 60 of the faceplate to the printed circuit board is of electrically isolating material which includes a spacer 62 to provide the minimum distance between board and faceplate.

Figure 5:
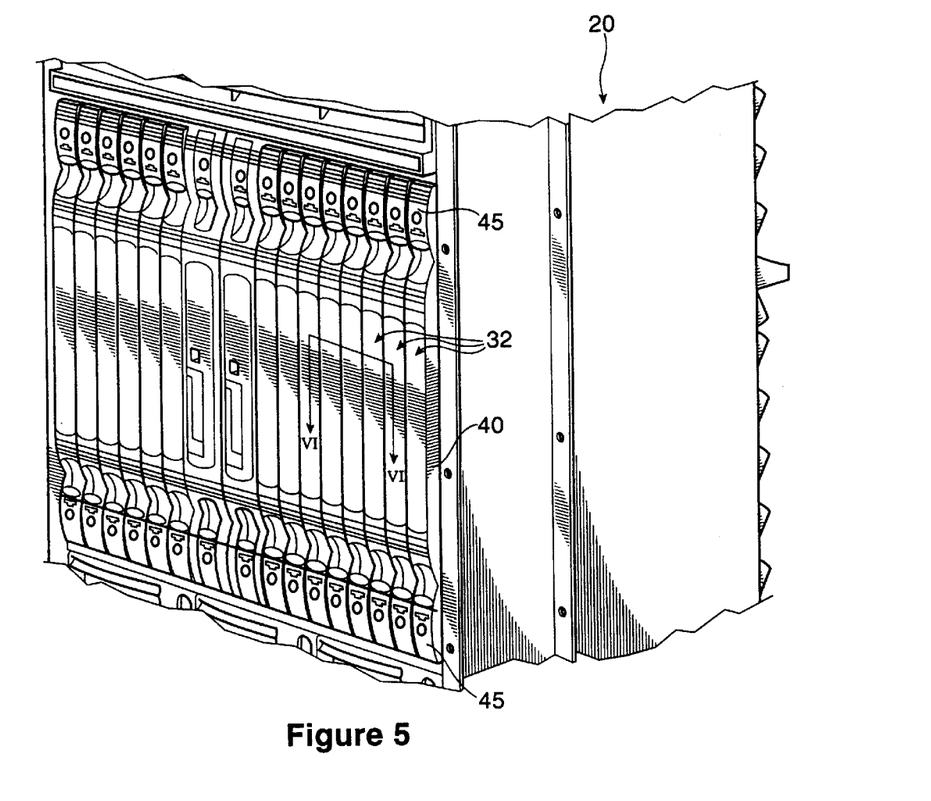
FIG. 5 is a front isometric view of the shelf of FIG. 2 and carrying a plurality of circuit packs according to the embodiment.
Figure 6:
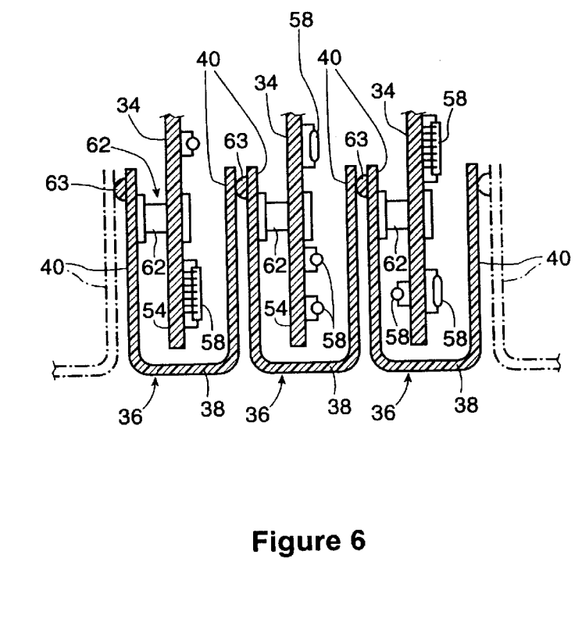
FIG. 6 is a horizontal cross-sectional view of a plurality circuit packs taken along line Vl—Vl in FIG. 5.

In addition, when the circuit pack 32 is located in the shelf 20 together with other similar circuit packs 32 as shown by FIGS. 5 and 6, then the side flanges 40 provide some electromagnetic radiation shielding between the forward extensions 54 of electronic circuitry of adjacent packs. This is shown by FIG. 6 in which the side flanges extend to either side of the electronic circuitry of its respective pack.

Further, one of the side flanges of each of the packs 32 shown in FIG. 6, has a sealing means in the form of an electrically conductive compressible seal 63 extending along its rear edge and short end seals 64 of similar construction, (FIGS. 2 and 3) are provided upon top and bottom flanges 66 of the faceplate. The seals 63 engage against opposite flanges of adjacent circuit packs 32 and the end seals engage against shelf surfaces (see FIG. 3). The seals 63 and 64 which are necessarily provided rearwardly of the latches to allow for latch movement, complete an electromagnetic radiation shield across the front of the shelf by eliminating any gaps between the packs and between the packs and the shelf. Grounding is effected for electromagnetic radiation and for electrostatic discharge through the material of the shelf and to ground.

Figure 4:
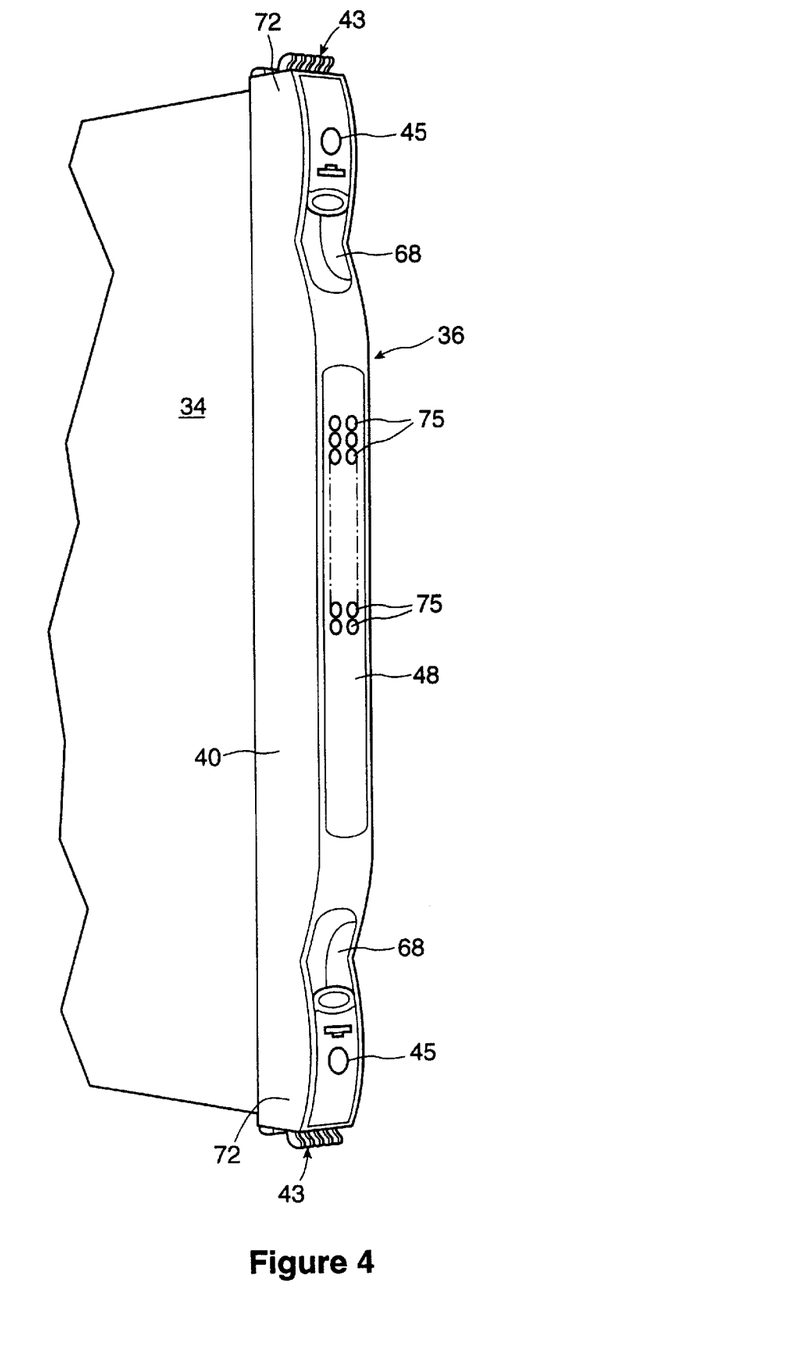
FIG. 4 is a front isometric view of the circuit pack of the embodiment.

Also, as may be seen from FIGS. 2, 3 and 4 particularly, as the intermediate front wall part 48 of the faceplate extends at least as far forward as the operating levers 45 of the latches 43, when in their locking positions, then to enable an operator's finger to be inserted behind the levers, a space 68 is provided between ends of the intermediate front wall part 48 and ends of the levers. This space extends beneath the levers with the latches in their locking positions by a dish formation 70 provided by the merging of the intermediate front wall part 48 with the end parts 47 of the front wall. Hence, a finger may be located behind the operating levers for moving the latches out of their locking positions. Also, the operating levers 45 are shrouded at their side edges when in the locking positions, by the side flanges 40 which have extensions 72 forwardly from the end parts 47 of the front wall (FIG. 4).

Figure 7:
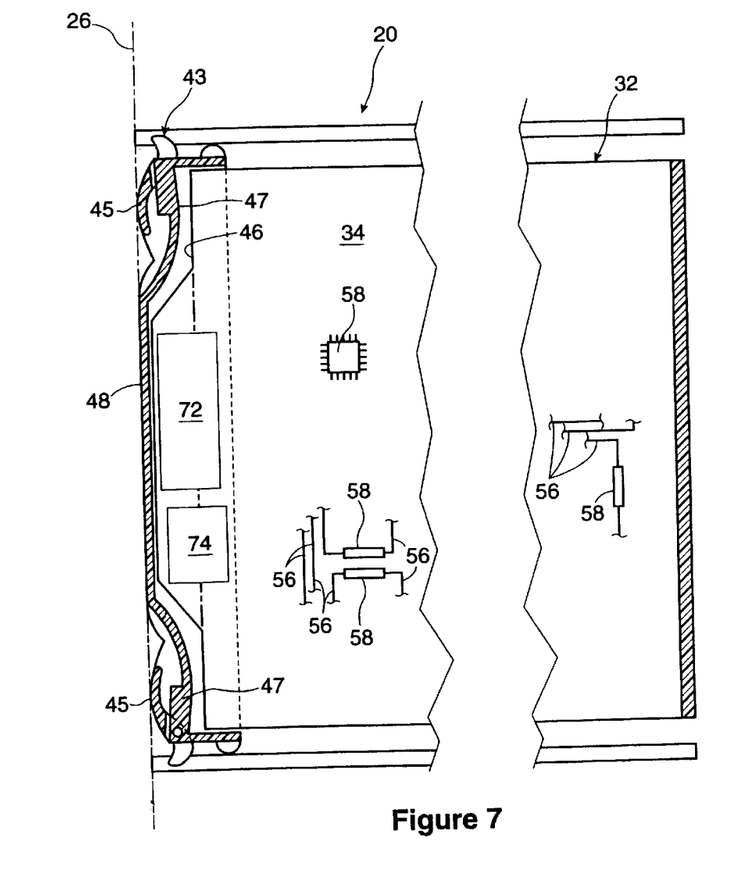
FIG. 7 is a view similar to FIG. 3 of a modification of the circuit pack of the embodiment, fitted into a shelf.

In a modification of the embodiment described above, the part of the printed circuit board 34 directly behind the intermediate front wall part 48 does not extend as far forward as in the embodiment. In the modification as shown by FIG. 7, the additional space provided behind the intermediate front wall part 48 is mainly occupied by at least one test connector 72 and a memory card 74 of the electronic circuitry. This connector 72 is mounted upon the printed circuit board 34 and faces forwardly for connection through orifices 75 (see also FIG. 4) to a mating connector (not shown) which is to be used for test purposes of the circuitry of the pack.

Circuit packs of the invention also provide at least one further advantage.

For instance, a plurality of circuit packs 32 of the first embodiment, or of the modification thereof, may be used in conjunctin with circuit packs of different design and which have inlets or outlets at fronts of the faceplates for transmission cables which may either be electrical or optical cables.

Figure 8:
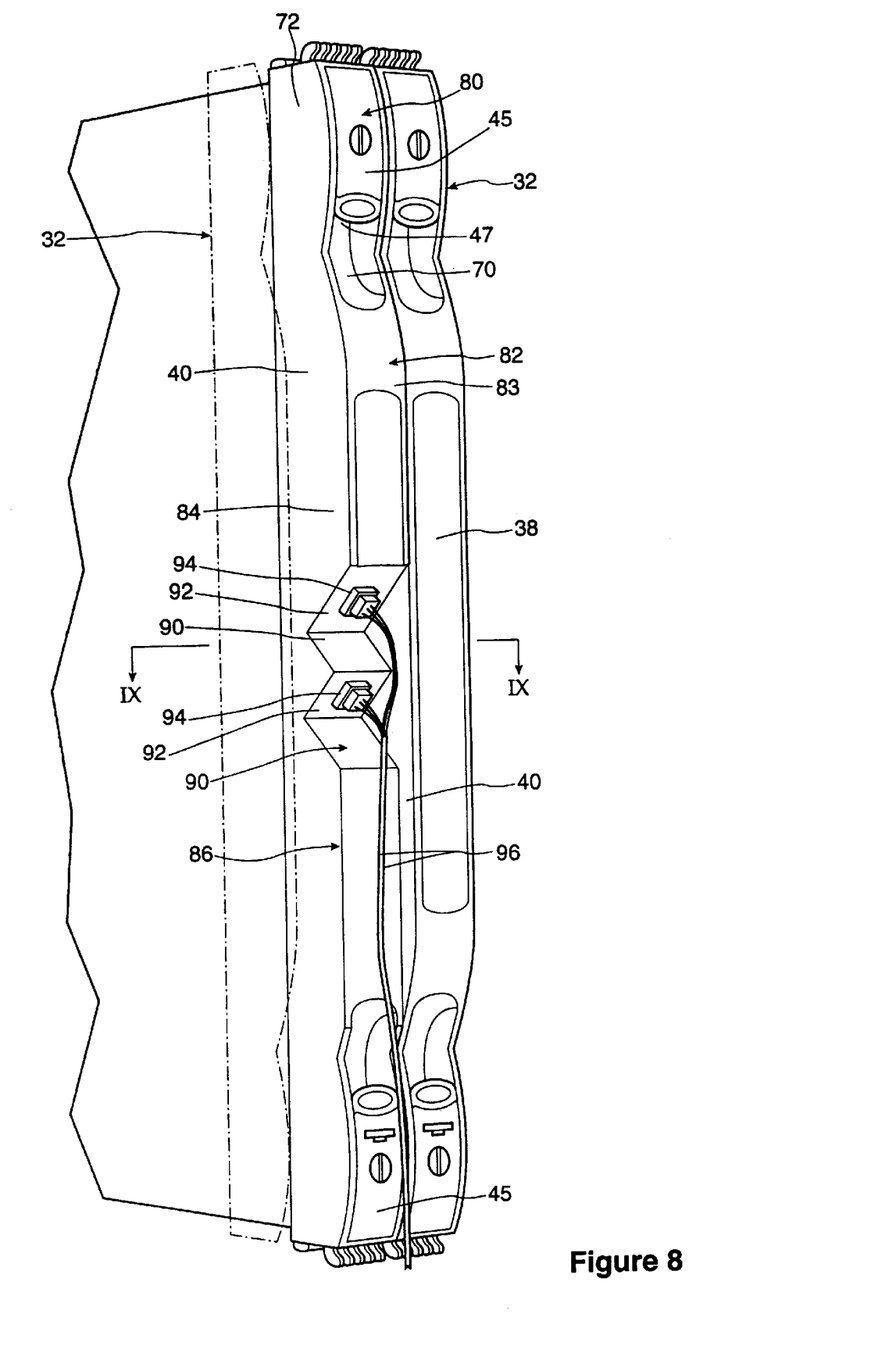
FIG. 8 is an isometric view of parts of a plurality of circuit packs shown in their relationship within a shelf and according to a second embodiment.
Figure 9:
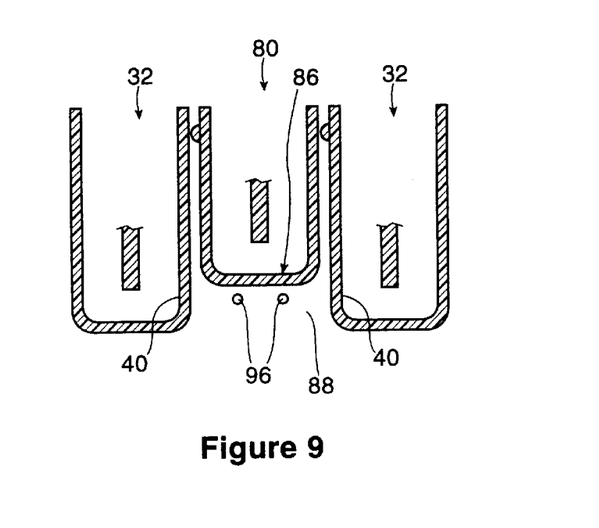
FIG. 9 is a cross-sectional view taken along line lX—lX in FIG. 8.

By way of example, in a second embodiment, in a shelf (not shown) a plurality of circuit packs 80 having such inlets or outlets are employed (only one circuit pack 80 being shown). As shown in FIGS. 8 and 9, each circuit pack 80 is flanked at each side by a circuit pack 32. Each circuit pack 80 has, mainly for esthetic reasons, a faceplate 82 which is basically the shape of the faceplates of the circuit packs 32. Thus, as in each circuit pack 32, each circuit pack 80 has two operating levers 45 disposed in front of end parts 47 of a front wall, with dish formations 70 and side flanges 40 with extensions 72 to shroud the operating levers in their locking positions.

Each circuit pack 80 differs from the circuit packs 32 in the construction of its front wall 83 of the faceplate 82. As may be seen from FIGS. 8 and 9, the front wall 83 has an upper region 84 which comforms to the design and forward positioning of the front walls 38 of the circuit packs 32. However, a lower region 86 of the front wall is disposed rearwardly of the upper regions 84 and thus of the front walls 38. As shown particularly by FIG. 9, a vertically extending valley 88 is thus provided by side flanges 40 of the circuit packs on either side of each circuit pack 80, the bottom of the valley being formed by the lower region 86 of the front wall 83. At upper parts of the lower region 86 are provided two horizontally extending V-shaped recesses 90 which present two downwardly inclined front end wall surfaces 92. Each surface 92 has an optical connector 94 mounted through an orifice provided in that part of the wall. Optical cables 96 extend to the front of the shelf and are connected by the connectors 94 to further cables (not shown) within the shelf and connected to optical devices mounted within the circuitry of the board of the circuit pack 80.

As may be seen from FIGS. 8 and 9, the optical cables 96 in extending upwardly to the connectors 94, are automatically disposed within the valley 88 of its circuit 80 defined between the opposing side flanges of the flanking circuit packs 32. The location of the optical cables 96 in this manner clearly provides a protection for the cables as they are rearwardly positioned relative to the front walls of the faceplates 36 of the flanking circuit packs 32.

The embodiments of the invention in which an exclusive right or privilege is claimed are defined as follows:

1. An electronic circuit pack comprising a substrate carrying electronic circuitry and a faceplate mounted to a front region of the substrate, and the faceplate having a front wall extending along and forwardly of the front region of the substrate, and the front wall having:
   i) two end parts provided at end regions of the faceplate, each end region carrying means for securing the circuit pack into a shelf; and
   ii) an intermediate part extending between the two end parts and disposed forwardly of the two end parts;
   a portion of the electronic circuitry directly behind the intermediate part of the front wall projecting forwardly of the two end parts of the front wall and towards the intermediate part.

2. An electronic circuit pack according to claim 1, wherein the securing means comprises two latches each of which comprises an operating lever and is moveable into a locking position in which the operating lever extends alongside and forwardly of a respective end part of the front wall and the intermediate part of the front wall is disposed at least as far forwards as the operating levers when the latch is in its locking position.

3. An electronic circuit pack according to claim 2, wherein the intermediate part of the front wall is spaced at its ends from the operating levers of the latches when the latches are in their operating positions to allow an operator to reach behind the operating levers to move the latches out of their operating positions.

4. An electronic circuit pack according to claim 2, wherein the faceplate has two side flanges extending rearwardly, one from each side edge of the front wall, to space the side flanges apart and facing each other, and the portion of the electronic circuitry directly behind the intermediate part of the front wall extends between the flanges.

5. An electronic circuit pack according to claim 4, wherein the intermediate part of the front wall is spaced at its ends from the operating levers with the latches in their operating positions to allow an operator to reach behind the operating levers and move the latches out of their latching positions, and ends of the side flanges extend forwards from the end parts of the front wall to shroud side edges of the operating levers of the latches.

6. An electronic circuit pack according to claim 4, wherein the faceplate has rearwardly extending end walls and the front wall, end walls and side flanges have electrically conductive surfaces to provide an electromagnetic radiation shield, the electronic circuitry is electrically isolated from the faceplate, and electrically conductive sealing means is provided to seal against an adjacent circuit pack and against a shelf, when the circuit pack is in an operational position with the shelf, to provide ground for the faceplate through the shelf.

7. An electronic circuit pack according to claim 1, wherein the portion of the electronic circuitry projecting forwardly of the two end parts of the front wall and towards the intermediate part of the front wall comprises a forward extension of the substrate, the forward extension carrying electrically conductive lines.

8. An electronic circuit pack according to claim 7, wherein the forward extension of the substrate also carries electronic components.

9. An electronic circuit pack according to claim 1, wherein the portion of the electronic circuitry projecting forwardly of the two end parts of the front wall and towards the intermediate part of the front wall, comprises at least one electronic circuitry test connector which is mounted upon the substrate and faces forwardly for connection through orifices in the front wall of the faceplate, for mating to a mating connector for test purposes.

10. An electronic circuit pack according to claim 1, wherein the portion of the electronic circuitry projecting forwardly of the two end parts of the front wall and towards the intermediate part of the front wall, comprises at least one memory card mounted upon the substrate.

11. A shelf and electronic circuitry pack combination comprising:
a shelf having a frontal plane and a receiving station for a circuit pack with an opening through the frontal plane of the shelf for accepting the circuit pack into an operational position within the shelf with the frontal plane providing a forward limiting position for the combination; and
an electronic circuit pack comprising a substrate carrying electronic circuitry and a faceplate mounted to a front region of the substrate, and the faceplate having a front wall extending along and forwardly of the front region of the substrate, and the front wall having:
i) two end parts provided at end regions of the faceplate, each end region carrying means for securing the circuit pack into a shelf; and
ii) an intermediate part extending between the two end parts and disposed forwardly of the two end parts;
a portion of the electronic circuitry directly behind the intermediate part of the front wall projecting forwardly of the two end parts of the front wall and towards the intermediate part whereby, when the circuit pack is in its operational position within the shelf, the intermediate part of the front wall and the portion of the electronic circuitry directly behind the intermediate part of the front wall lie forwardly of the two end parts of the front wall at least towards the frontal plane.

12. A combination according to claim 11, wherein the intermediate part of the front wall has a front face which substantially coincides with the frontal plane of the shelf.

13. A combination according to claim 11, wherein the shelf has a plurality of receiving stations for receiving a plurality of circuit packs in side-by-side relationship, and adjacent circuit packs each have two side flanges extending rearwardly, one from each side edge of the respective front wall to space the side flanges apart and facing each other, and in the circuit packs the portions of the electronic circuitry directly behind the intermediate portions of the front walls extend between the side flanges of their respective packs, each of these portions being sealed from electromagnetic radiation emitted by others of these portions by the side flanges which have electrically conductive surfaces and are grounded within the shelf.

14. A combination according to claim 13, wherein the side flanges of adjacent circuit packs are electrically connected together by electrically conductive seals between the side flanges, and the circuit packs, at their ends, are electrically connected to the shelf also by electrically conductive seals for ground purposes, and the seals between the side flanges and between the ends of the circuit packs and the shelf are located rearwardly of the securing means and form a complete electromagnetic radiation shield across the front of the shelf.

15. An electronic circuit pack comprising a substrate for carrying electronic circuitry and a faceplate located adjacent an edge of said substrate, said faceplate defining a surface which provides two end surface portions thereof each adjacent to a respective terminal end of said edge, said surface further providing an intermediate surface portion thereof which extends between said end surface portions in a first direction longitudinally along said edge of said substrate and in a second direction transversely thereto and transversely to said substrate, said end surface portions each extending along said edge of said substrate in said same first and second directions as said intermediate surface portion and wherein said intermediate surface portion extends away from said end surface portions in a third direction transverse to said first direction and transverse to said second direction such that when said electronic circuit pack is received in an equipment enclosure therefor, said surface of said faceplate is oriented in a direction outwardly of said enclosure and said intermediate surface portion thereof extends away from said end surface portions thereof outwardly of said enclosure.

16. An electronic circuit pack according to claim 15, wherein said faceplate further comprising securing means for securing said electronic circuit pack into said equipment enclosure, said securing means provided adjacent to said end surface portions of said faceplate.

17. An electronic circuit pack according to claim 16, wherein said securing means comprises two latches each of which comprises an operating lever and is moveable into a locking position in which said operating lever extends in said first direction longitudinally along said edge of said substrate and said operating lever extends in said third direction outwardly of said enclosure and said end surface portions.

18. An electronic circuit pack according to claim 17, wherein said intermediate surface portion extends in said third direction outwardly of said enclosure at least as far as all surfaces of said operating levers when said latch is in its locking position.

19. An electronic circuit pack according to claim 17, wherein said intermediate surface portion is spaced at its ends adjacent to said end surface portions from said operating levers of said latches when said latches are in their operating positions to allow an operator to reach between said operating levers and said end surface portions to move said latches out of their operating positions.

20. An electronic circuit pack according to claim 17, wherein said faceplate further comprises two side flanges, said two side flanges extending longitudinally along said faceplate in said first direction, one of said side flanges extending from each longitudinal edge of said faceplate in said third direction inwardly of said enclosure, said surface of said faceplate functioning to space said side flanges apart and facing each other.

21. An electronic circuit pack according to claim 20, wherein said intermediate surface portion is spaced at its ends adjacent to said end surface portions from said operating levers of said latches with said latches in their operating positions to allow an operator to reach between said operating levers and said end surface portions and move said latches out of their operating positions.

22. An electronic circuit pack according to claim 21, wherein ends of said side flanges adjacent to said end surface portions extend outwardly of said enclosure in said third direction from said end surface portions to shroud side edges of said operating levers of said latches.

23. An electronic circuit pack according to claim 20, wherein said faceplate further comprises terminal walls extending between said side flanges adjacent to said terminal ends of said edge of said substrate in said second direction and said third direction and surfaces of said faceplate adjacent to said substrate have electrically conductive surfaces to provide an electromagnetic radiation shield and wherein electronic circuitry in said electronic circuit pack is electrically isolated from said faceplate.

24. An electronic circuit pack according to claim 23, wherein said faceplate further comprises electrically conductive sealing means, said sealing means provided to seal against an adjacent faceplate of an adjacent electronic circuit pack and against a side of said enclosure when said faceplate of said electronic circuit pack is in an operational position with said enclosure and to provide ground for said faceplate through said side of said enclosure.

25. An electronic circuit pack comprising a substrate carrying electronic circuitry and a faceplate mounted to a front region of the substrate, and the faceplate having a front wall extending along and forwardly of the front region of the substrate, and the front wall having:
  i) two end parts provided at end regions of the faceplate, each end region carrying means for securing the circuit pack into a shelf comprising two latches each of which comprises an operating lever and is moveable into a locking position in which the operating lever extends alongside and forwardly of a respective end part of the front wall;
  ii) an intermediate part extending between the two end parts and disposed forwardly of the two end parts and the intermediate part of the front wall is spaced at its ends from the operating levers with the latches in their operating positions to allow an operator to reach behind the operating levers and move the latches out of their latching positions; and
  iii) two side flanges extending rearwardly, one from each side edge of the front wall, to space the side flanges apart and facing each other and ends of the side flanges extend forwards from the end parts of the front wall to shroud side edges of the operating levers of the latches;
  wherein a portion of the electronic circuitry directly behind the intermediate part of the front wall projecting forwardly of the two end parts of the front wall and towards the intermediate part extending between the flanges.

26. An electronic circuit pack comprising a substrate carrying electronic circuitry and a faceplate mounted to a front region of the substrate, and the faceplate having a front wall extending along and forwardly of the front region of the substrate, and the front wall having:
  i) two end parts provided at end regions of the faceplate, each end region carrying means for securing the circuit pack into a shelf; and
  ii) an intermediate part extending between the two end parts and disposed forwardly of the two end parts;
  wherein a portion of the electronic circuitry directly behind the intermediate part of the front wall projecting forwardly of the two end parts of the front wall and towards the intermediate part, the portion of the electronic circuitry comprising a forward extension of the substrate, the forward extension carrying electrically conductive lines.

27. An electronic circuit pack according to claim 26, wherein the forward extension of the substrate also carries electronic components.

28. An electronic circuit pack comprising a substrate carrying electronic circuitry and a faceplate mounted to a front region of the substrate, and the faceplate having a front wall extending along and forwardly of the front region of the substrate, and the front wall having:
  i) two end parts provided at end regions of the faceplate, each end region carrying means for securing the circuit pack into a shelf; and
  ii) an intermediate part extending between the two end parts and disposed forwardly of the two end parts;
  a portion of the electronic circuitry directly behind the intermediate part of the front wall projecting forwardly of the two end parts of the front wall and towards the intermediate part, said portion of the electronic circuitry comprising at least one memory card mounted upon the substrate.

* * * * *